US012635433B2

(12) United States Patent
Lex et al.

(10) Patent No.: US 12,635,433 B2
(45) Date of Patent: May 19, 2026

(54) METHOD FOR PRODUCING A SUBSTRATE HAVING A STRUCTURED SURFACE, AND SUBSTRATE HAVING A STRUCTURED SURFACE

(71) Applicant: ams-OSRAM International GmbH, Regensburg (DE)

(72) Inventors: Andreas Lex, Zandt (DE); Adrian Stefan Avramescu, Regensburg (DE); Martin Herz, Altdorf (DE); Christian Grassl, Regensburg (DE); Sebastian Taeger, Bad Abbach (DE); Robert Walter, Parsberg (DE)

(73) Assignee: ams-OSRAM International GmbH, Regensburg (DE)

( * ) Notice: Subject to any disclaimer, the term of this patent is extended or adjusted under 35 U.S.C. 154(b) by 308 days.

(21) Appl. No.: 18/266,909

(22) PCT Filed: Nov. 10, 2021

(86) PCT No.: PCT/EP2021/081231
§ 371 (c)(1),
(2) Date: Jun. 13, 2023

(87) PCT Pub. No.: WO2022/128263
PCT Pub. Date: Jun. 23, 2022

(65) Prior Publication Data
US 2024/0055267 A1 Feb. 15, 2024

(30) Foreign Application Priority Data
Dec. 15, 2020 (DE) .......................... 102020215937.8

(51) Int. Cl.
*H10P 50/00* (2026.01)
*H10H 20/01* (2025.01)
(Continued)

(52) U.S. Cl.
CPC ........ *H10P 50/691* (2026.01); *H10P 14/2925* (2026.01); *H10P 50/283* (2026.01)

(58) Field of Classification Search
USPC ......................................................... 257/618
See application file for complete search history.

(56) References Cited

U.S. PATENT DOCUMENTS 9,614,136 B2 4/2017 Koike et al.
2002/0011642 A1* 1/2002 Dries .................. H10F 71/1272
257/E31.115
(Continued)

FOREIGN PATENT DOCUMENTS

CN 104377285 A 2/2015
DE 102014114109 A1 3/2016
(Continued)

*Primary Examiner* — Chineyere Wills-Burns
(74) *Attorney, Agent, or Firm* — Slater Matsil, LLP

(57) ABSTRACT
In an embodiment, a method for producing a substrate having a structured surface includes providing the substrate having a substrate body and having a surface to be structured, forming an absorption layer, a first mask layer and a second mask layer on the surface to be structured, forming openings in the second mask layer in which the first mask layer is exposed, exposing the surface to be structured in a region of the openings, forming depressions in the surface to be structured in the region of the openings to form the structured surface of the substrate and removing the absorption layer from the substrate.

15 Claims, 3 Drawing Sheets

(51) Int. Cl.
    H10H 20/819     (2025.01)
    H10P 14/20     (2026.01)
    H10P 50/28     (2026.01)

(56)           References Cited

U.S. PATENT DOCUMENTS

| 2007/0059852 | A1* | 3/2007 | Miyachi | H01L 21/02639 |
| | | | | 438/22 |
| 2011/0070720 | A1* | 3/2011 | Ohtsuka | H01L 21/76232 |
| | | | | 438/424 |
| 2011/0260202 | A1* | 10/2011 | Lutgen | H10H 20/821 |
| | | | | 438/22 |
| 2013/0105438 | A1 | 5/2013 | Zhu et al. | |
| 2013/0207143 | A1* | 8/2013 | Chou | H10H 20/819 |
| | | | | 438/22 |
| 2013/0280643 | A1* | 10/2013 | Hsu | H01L 21/0337 |
| | | | | 430/5 |
| 2014/0038320 | A1* | 2/2014 | Wang | H10H 20/013 |
| | | | | 438/22 |
| 2014/0057417 | A1* | 2/2014 | Leirer | H10H 20/01335 |
| | | | | 438/478 |
| 2014/0268087 | A1* | 9/2014 | Yu | B82Y 10/00 |
| | | | | 355/71 |
| 2015/0048380 | A1* | 2/2015 | Koike | H10H 20/855 |
| | | | | 438/16 |
| 2015/0270486 | A1* | 9/2015 | Bang | H10K 71/166 |
| | | | | 430/5 |
| 2015/0340292 | A1* | 11/2015 | Dong | H10D 84/038 |
| | | | | 438/199 |
| 2018/0254380 | A1* | 9/2018 | Muroo | H10H 20/817 |
| 2019/0172722 | A1* | 6/2019 | Chang | H01L 21/0337 |
| 2019/0355833 | A1* | 11/2019 | Miao | H10D 30/63 |
| 2020/0160533 | A1* | 5/2020 | Du | G06N 3/084 |
| 2020/0209451 | A1* | 7/2020 | Shibuya | G02B 5/3058 |
| 2022/0102152 | A1* | 3/2022 | Chen | H01L 21/02348 |

FOREIGN PATENT DOCUMENTS

| DE | 102016200953 A1 | 7/2017 |
| EP | 2825836 A1 | 2/2015 |

* cited by examiner

METHOD FOR PRODUCING A SUBSTRATE HAVING A STRUCTURED SURFACE, AND SUBSTRATE HAVING A STRUCTURED SURFACE

CROSS-REFERENCE TO RELATED APPLICATIONS

This patent application is a national phase filing under section 371 of PCT/EP2021/081231, filed Nov. 10, 2021, which claims the priority of German patent application 102020215937.8, filed Dec. 15, 2020, each of which is incorporated herein by reference in its entirety.

TECHNICAL FIELD

The present application relates to a method of producing a substrate having a structured surface and to such a substrate.

BACKGROUND

Substrates employed for the production of light-emitting diodes (LEDs for short) based on nitride compound semiconductors are often those that are transparent to radiation in the visible region, for example sapphire substrates or gallium nitride substrates.

It is often desirable to conduct epitaxial deposition on structured substrates, for example in order to improve light outcoupling or to reduce defects or for growth of three-dimensional structures.

For this purpose, it is desirable to have structure sizes that cannot be produced readily by conventional methods.

SUMMARY

Embodiments provide a method by which small structure sizes can be produced reliably and especially also in a form suitable for mass production. Further embodiments provide a structured substrate with improved properties.

A method is specified for production of a substrate having a structured surface. The substrate to be produced is especially a growth substrate for epitaxial deposition of semiconductor material, for example based on nitride compound semiconductor material.

In at least one embodiment of the method, the method comprises a step in which a substrate having a substrate body and a surface to be structured is provided.

The substrate body is especially the element of the substrate that has the greatest thickness and assures sufficient mechanical stability of the substrate.

The surface to be structured may be a surface of the substrate body or a surface which is spaced apart from the substrate body and especially runs parallel to a surface of the substrate body. The substrate body is transparent, for example, to radiation in the visible spectral region. For example, the substrate body contains sapphire, gallium nitride, or another semiconductor material which is transparent within the visible spectral region.

What is meant by "transparent" in the context of the application is that the element in question in each case transmits at least 90% of at least 95% of the radiation incident on the element with perpendicular incidence of the radiation.

In at least one embodiment of the method, the method comprises a step in which an absorption layer is formed on the surface to be structured.

For example, the absorption layer is applied by a deposition method, for instance by chemical gas phase deposition (CVD) or physical gas phase deposition (PVD). For example, the absorption layer is designed in terms of its layer thickness and its coefficient of absorption such that radiation, in the case of perpendicular incidence of radiation, at least for one wavelength within the visible spectral region, is absorbed in the absorption layer in a proportion of at least 15%.

For example, a suitable semiconductor material for the absorption layer is one having a bandgap sufficiently small that radiation in the visible spectral region is at least partly absorbed. For example, germanium, silicon or titanium nitride is suitable for the absorption layer.

A layer thickness of the absorption layer is, for example, between 30 and 500 nm inclusive, especially between 50 and 300 nm inclusive.

In at least one embodiment of the method, the method comprises a step in which a first mask layer is formed on the surface to be structured, especially on the absorption layer. The first mask layer is formed, for example, by a material that features high stability with respect to wet-chemical etching methods and/or to a particular dry-chemical etching method.

In at least one embodiment of the method, a second mask layer is formed on the surface to be structured. In particular, the second mask layer is formed atop the first mask layer, such that the first mask layer is disposed between the surface to be structured and the second mask layer. For example, the second mask layer is a photoresist or another material structurable by an exposure method.

In particular, the first mask layer and the second mask layer are matched to one another such that the second mask layer is structurable by an etching method which is selective with respect to the first mask layer. The second mask layer can thus be structured by the etching method without also removing the first mask layer at the same time.

What is meant by selectivity of an etching method with respect to a material or a layer in the context of the application is more particularly that an etch rate of the etching method is significantly greater for the material to be etched by the etching method than for the material. This material, for example, adjoins the material to be etched at least in places. For example, an etch rate of the etching method for the material to be etched, for example for the second mask layer, is at least twice or at least ten times that for the material which is not to be etched by that etching method, for example for the first mask layer.

In at least one embodiment of the method, the method comprises a step in which openings are formed in the second mask layer. In particular, the first mask layer is exposed in the openings. The openings thus extend completely through the second mask layer. For example, the openings are formed by a wet-chemical method, wherein the etching stops or is at least considerably slowed at the material that follows in the direction of the surface to be structured, for example at the first mask layer.

In at least one embodiment of the method, the method comprises a step in which the surface to be structured is exposed in the region of the openings. This is affected, for example, in such a way that the surface to be structured has not yet been structured in this step.

In at least one embodiment of the method, the method comprises a step in which depressions in the surface to be structured are formed in the region of the openings, as a result of which a structured surface of the substrate is formed. The first mask layer may serve as a mask for the forming of the depressions.

In at least one embodiment of the method, the method comprises a step in which the absorption layer is removed from the substrate. The absorption layer is thus no longer present in the finished substrate.

In at least one embodiment of the method of producing a substrate having a structured surface, a substrate having a substrate body and having a surface to be structured is provided. An absorption layer, a first mask layer and a second mask layer are formed on the surface to be structured, especially in the sequence specified. Openings are formed in the second mask layer, in which the first mask layer is exposed. The surface to be structured is exposed in the region of the openings. Depressions are formed in the surface to be structured in the region of the openings, as a result of which the structured surface of the substrate is formed. The absorption layer is removed from the substrate.

The depressions in the structured surface of the substrate are thus formed in a multistage method in which different etching methods and at least two mask layers are employed. It has been found that it is thus possible to achieve, in a particularly efficient and reliable manner, structuring with small structure sizes and/or center-to-center distances, especially also in the case of transparent substrates. By means of the absorption layer, the suitability of the method the mass production is improved, since, for example, machines that work by an automated optical recognition method are able to reliably recognize and process the substrates to be structured.

In at least one embodiment of the method, the surface to be structured is a surface of the substrate body. In this case, the depressions thus extend into the substrate body. The substrate body provided for the method is, for example, an unstructured one-piece body. In that case, the absorption layer may be formed directly on the surface of the substrate body. There is thus no further layer between the substrate body and the absorption layer.

In at least one embodiment of the method, the surface to be structured is a surface of a layer applied to the substrate body. The layer is, for example, a dielectric layer which is transparent to radiation in the visible spectral region. For example, an oxide such as silicon oxide or aluminum oxide, or a nitride, for instance silicon nitride, is suitable for the dielectric layer.

In this case, the depressions may extend completely through the layer or end at the surface of the substrate body or extend into the substrate body. At least in the region of the depressions, the substrate body is thus exposed at the structured surface.

In at least one embodiment of the method, the openings in the second mask layer are formed by means of a lithographic exposure method. The absorption layer is especially designed to be absorbent with respect to radiation used in the exposure method, for example in the infrared, visible or ultraviolet spectral region. By means of the absorption layer, it is possible to increase the reliability of the lithographic exposure method.

In at least one embodiment of the method, the exposing of the surface to be structured involves removing the first mask layer and the absorption layer by means of a dry-chemical etching method in the region of the openings. The second mask layer may serve here as mask. Examples of suitable dry-chemical etching methods are reactive ion etching (RIE), for instance reactive ion etching with inductively coupled plasma (ICP-RIE).

The surface to be structured is especially exposed in such a way that the dry-chemical etching method is selective with regard to the surface to be structured. In exposing of the surface to be structured, the surface to be structured itself is thus not attacked significantly, if at all.

In at least one embodiment of the method, the depressions are formed by an etching method which is selective with respect to the first mask layer. In the forming of the depressions, the first mask layer may serve as mask. The first mask layer is thus matched in terms of its material to the material that forms the surface of the substrate to be structured in such a way that the depressions can be formed selectively with respect to the first mask layer. By virtue of the selectivity of the etching method with respect to the first mask layer, it is possible to avoid enlargement of lateral extent of the openings in the first mask layer. This simplifies the production of small structure sizes.

In at least one embodiment of the method, the second mask layer is removed prior to the removing of the absorption layer. When the absorption layer is removed, the second mask layer is thus no longer present. During the removing of the second mask layer, there are at least parts of the surface of the substrates to be structured that are still covered by the absorption layer. In the removing of the second mask layer, the surface to be structured is thus still protected at least in parts by the absorption layer and optionally also the first mask layer.

In at least one embodiment of the method, the first mask layer is removed together with the absorption layer. For example, an etching method is employed for this purpose, which dissolves the absorption layer, such that the first mask layer is lifted off. The material of the first mask layer itself need not be removed here by the etching method.

In at least one embodiment of the method, the absorption layer is removed by a wet-chemical method. The wet-chemical method is selective especially with regard to the material of the surface of the substrate to be structured, such that the structured surface of the substrate is not attacked in this step.

After the absorption layer has been removed, a further clearing operation, for example a wet-chemical cleaning operation, can be conducted in order to remove organic and nonorganic residues from the substrate.

Additionally specified in a substrate having a structured surface.

The above-described method is particularly suitable for production of the substrate. Features cited in association with the method may therefore also be employed for the substrate, and vice versa.

In at least one embodiment of the substrate, the substrate is designed as a growth substrate for epitaxial deposition, wherein the substrate has a substrate body which is transparent, especially in the visible region, and wherein the structured surface has depressions which, at least in one direction, have a structure width of not more than 200 nm and/or a center-to-center distance of not more than 800 nm. The structure with here relates to an extent in lateral direction, i.e. parallel to the surface to be structured.

The substrate is thus notable for particularly small structure sizes.

In at least one embodiment of the substrate, the structured surface is a surface of the substrate body. By epitaxial growth proceeding from a structured surface of a substrate body, smaller defect densities are thus possible, and or, in the case of radiation-emitting components, improved beam outcoupling through the substrate body.

In at least one embodiment of the substrate, the structured surface is formed by a layer disposed atop the substrate body. Such a substrate is suitable, for example, for epitaxial deposition, in which the epitaxial growth is to proceed from particular regions of the substrate, whereas no epitaxial growth proceeds from the layer disposed atop the substrate body. However, the layer may be covered by epitaxial lateral growth. This can achieve regions with particularly low defect densities.

BRIEF DESCRIPTION OF THE DRAWINGS

Further configurations and benefits will be apparent from the description of the working examples that follows, in conjunction with the figures.

DETAILED DESCRIPTION OF ILLUSTRATIVE EMBODIMENTS

Figure 1A:
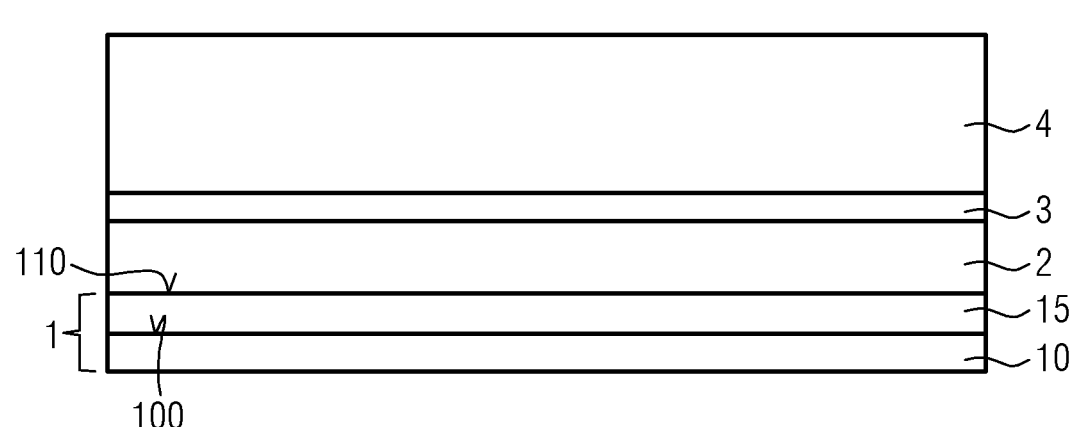
FIGS. 1A to 1F show a working example of a method of producing a substrate with a structured surface using intermediate steps that are each represented in a schematic section view, with FIG. 1F showing a working example of a completed substrate.

Elements that are the same, of the same type or have the same effect are given the same reference numerals in the figures.

The figures are each schematic diagrams and therefore not necessarily true to scale. Instead, comparatively small elements and especially layer thicknesses can be shown in excessively large size for clarity.

In the working example shown in FIGS. 1A to 1F, only part of the region of the substrate to be produced is shown, in which a depression is formed. The substrate may have a multitude of such depressions.

In the working example shown in FIGS. 1A to 1F, a substrate 1 with a surface 110 to be structured is provided. The substrate 1 has a substrate body 10 and a layer disposed atop the substrate body 15, for example a dielectric layer. The layer 15 is disposed atop a surface 100 of the substrate body 10 and covers it, especially over the full area.

In the figures, for better representability, only the upper portion of the substrate body 10 is shown in the region of the surface 100 of the substrate body. The substrate body 10 is the element of the substrate 1 that has the greatest thickness, i.e. the greatest vertical extent in a direction perpendicular to the surface 110 to be structured. For example, the substrate body 10 has a thickness of at least 100 μm or at least 200 μm and/or at most 2 mm or at most 1 mm.

A suitable substrate body 10 is, for example, sapphire or gallium nitride. However, it is also possible to employ a different material, for example gallium phosphide.

A thickness of the layer 15 is, for example, between 10 and 200 nm inclusive.

A dielectric material, for example, is suitable for layer 15, for instance an oxide such as silicon oxide or aluminum oxide, or a nitride, for instance silicon nitride.

An absorption layer 2, a first mask layer 3 and a second mask layer 4 are applied to the surface 110 to be structured.

A suitable material for the absorption layer 2 is, for example, one which absorbs in the visible spectral region, for instance a semiconductor material having a comparatively small bandgap, for example germanium or silicon.

A thickness of the absorption layer is, for example, between 50 nm and 300 nm inclusive, for example 150 nm.

A suitable material for the first mask layer is, for example, a transparent conductive oxide (TCO) such as indium tin oxide (ITO). A layer thickness of the first mask layer is, for example, between 15 nm and 150 nm inclusive. A suitable material for the second mask layer 4 is, for example, a photoresist.

Figure 1B:
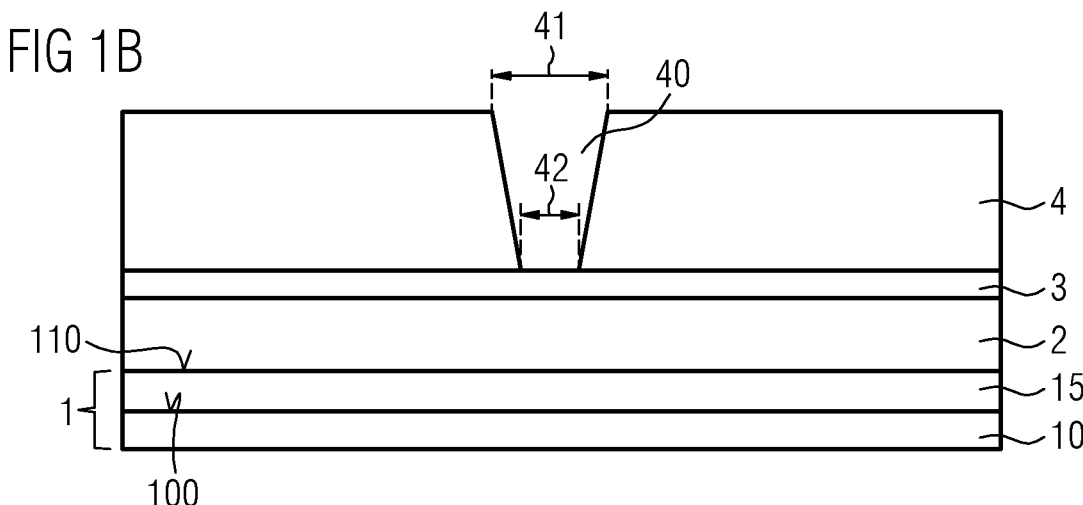

Formed in the second mask layer 4, as shown in FIG. 1B, are openings 40, in which the first mask layer 3 is exposed. This purpose is suitably served, for example, by a lithography method, followed by wet-chemical etching of the second mask layer 4. The openings 40 narrow toward the substrate 1, such that a first extent 41 on a side of the second mask layer 4 remote from the substrate 1 is greater than a second extent 42 on a side facing the substrate 1. For example, the second extent 42 may be at most half as great as the first extent 41. For example, a second extent 42 of 190 nm was achieved in the case of a first extent 41 of 460 nm.

The first mask layer 3 and the second mask layer 4 are matched here to one another such that the wet-chemical etching stops at the second mask layer 3.

Figure 1C:
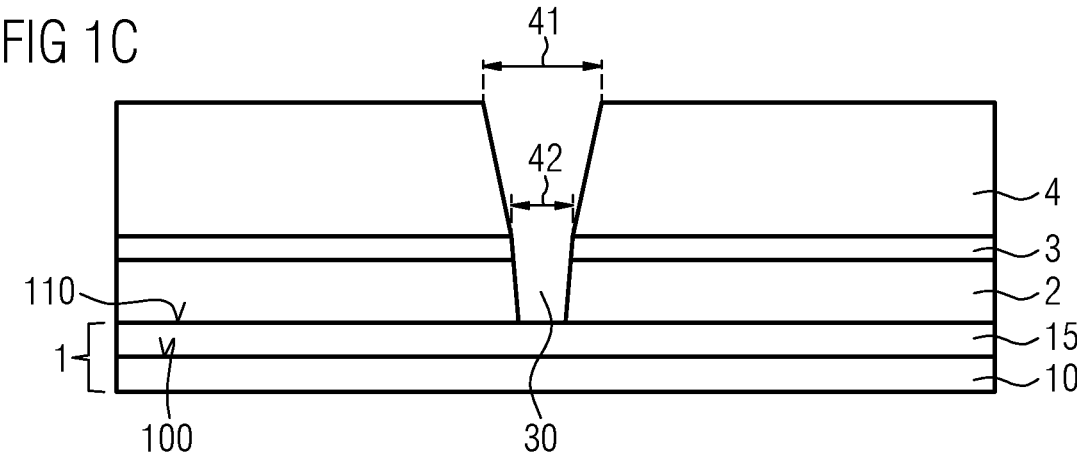

In the step shown in FIG. 1C, the second mask layer 4 serves as an etching mask for a dry-chemical etching method in which the surface 110 to be structured is exposed. Further openings 30 are formed here, which extend through the first mask layer 3 and the absorption layer 2. The dry-chemical etching method which is used for the forming of the further openings 30 is selective with respect to the material at the surface 110 to be structured, i.e. the material of layer 15, such that the etching stops at the surface 110 to be structured. This purpose is served, for example, by an ICP-RIE method based on fluorine chemistry, which etches ITO, for example, as the first mask layer, but not SiO2 as layer 15 of the surface 110 to be structured. The material at the surface 110 to be structured and of the first mask layer 3 are thus matched to one another such that the first mask layer 3 is etched efficiently without attacking the surface 110 to be structured.

Figure 1D:
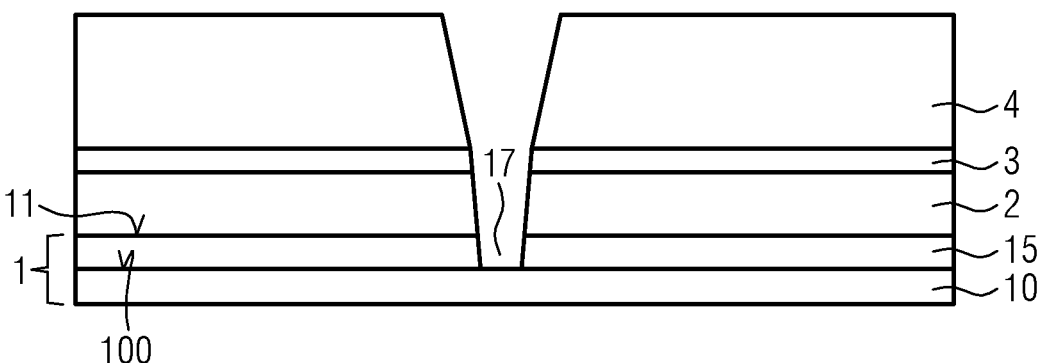
Figure 1E:
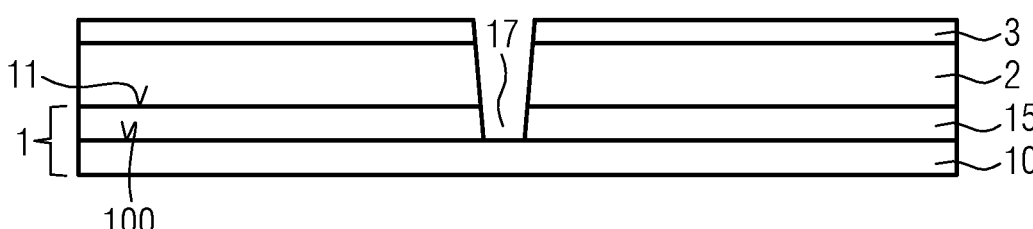

The further openings 30 narrow toward the substrate 1. Subsequently, as shown in FIG. 1D, depressions 17 are formed in the surface 110 to be structured. As a result, the structured surface 11 is formed. The depressions 17 can extend right through the layer 15, such that the substrate body 10 is exposed in the depressions 17.

A dry-chemical etching method which is employed with preference for the forming of the depressions 17 is selective with respect to the first mask layer 3. This can avoid any increase in the width of the further openings 30 at the level of the first mask layer 3 during the etching operation. This could lead to broadening of the structure to be produced.

For example, a dry-chemical etching method based on chlorine chemistry is suitable for this purpose when ITO is used for the first mask layer 3.

Subsequently, the second mask layer 4 is removed (FIG. 1E), for example by wet-chemical etching. Thereafter, the absorption layer 2 is removed by a wet-chemical etching method. This also lifts off the first mask layer 3 disposed atop the absorption layer 2. The first mask layer 3 is thus removed without having to attack the material of the first mask layer 3 itself by means of the wet-chemical etching method for the etching of the absorption layer 2.

Nor is the structured surface 11 attacked by this method, and so the structuring of the structured surface 11 is at least not significantly altered, if at all.

Finally, a cleaning operation can be conducted in order to remove organic or nonorganic residues from the structured surface 11.

Figure 1F:
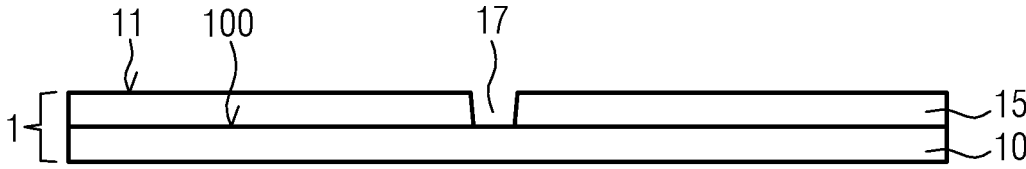

The completed substrate 1 shown in FIG. 1F thus has a structured surface 11 and is prepared for epitaxial deposition of semiconductor material on the structured surface 11. This is also referred to as epi-ready. The growth may proceed from the sites on the substrate body 10 that are exposed in the depressions 17.

The depressions 17 in the structured surface 11 have, for example, at least in one lateral direction, a structure width 171 of not more than 200 mm (cf. FIG. 2B) and/or a center-to-center distance 172 of not more than 800 nm.

The structure width 171 of the depressions 17 produced is not significantly less than the first extent 41 of the second mask layer 4 on the side remote from the substrate 1. The structure width is thus not restricted by the minimum first extent 41 achievable. By virtue of the production process described, it is thus possible to achieve structure widths which, through direct etching of the surface 110 to be structured, would not be achievable directly by a method suitable for mass production.

For example, the structured surface 11 has a multitude of trenches that run parallel to one another at the center-to-center distance 172, which extend in a lateral direction across the entire extent of the substrate 1 and have the structure width 171 perpendicular thereto. However, the depressions 17 may also have different shapes, especially also shapes that are surrounded around the entire circumference, for example round or polygonal basic shapes. In addition, it is also possible to form various structures atop the substrate 1.

For example, the specific material combination that follows has been found to be suitable: sapphire for the substrate body 10, silicon oxide having a layer thickness of 80 nm for layer 15, an absorption layer 2 having a layer thickness of 150 nm of germanium, a 50 nm-thick first mask layer 3 of ITO, and a photoresist for the second mask layer 4. However, the materials and layer thicknesses may be varied within wide limits.

Figure 2A:
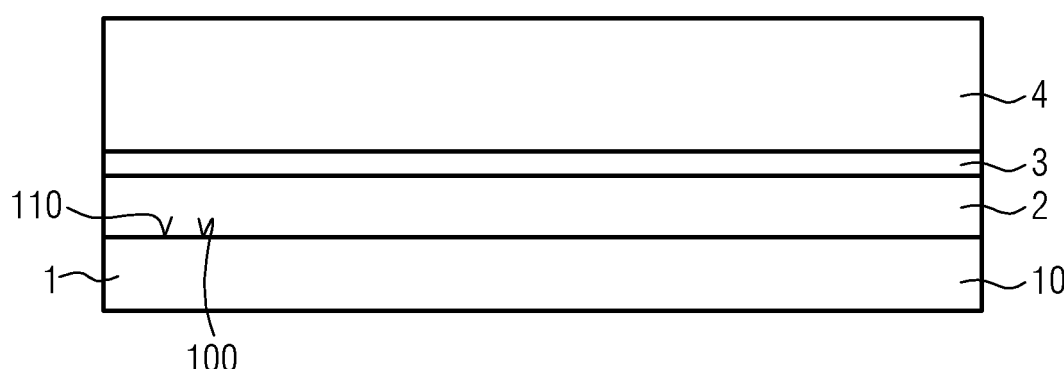
FIGS. 2A and 2B show a working example of a method of producing a substrate with a structured surface using intermediate steps that are each represented in a schematic section view, with FIG. 2B showing a working example of a completed substrate.
Figure 2B:
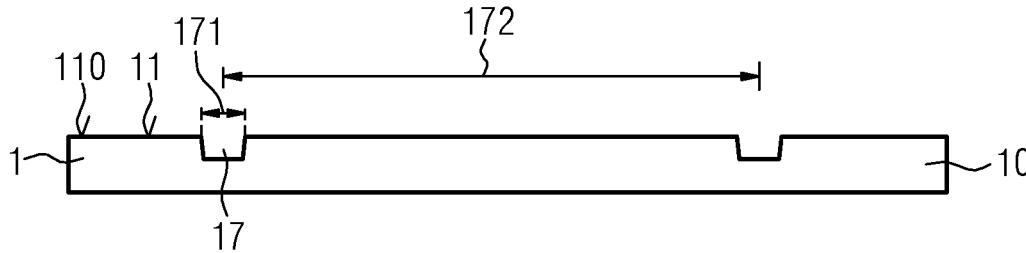

The working example shown in FIGS. 2A and 2B differs from the working example described in connection with FIGS. 1A to 1F in that the surface 110 to be structured is formed by a surface 100 of the substrate body 10. The absorption layer 2 is thus deposited directly on the substrate body 10.

The forming of the openings 40 in the second mask layer 4 and the forming of the further openings 30 in the first mask layer 3 for exposure of the surface 110 to be structured can be affected as described in connection with FIGS. 1B to 1D. The forming of the depressions 17 can in principle be affected as described in connection with FIG. 1E, with formation of the depressions directly in the substrate body 10. The depressions 17 thus extend into the substrate body 10. The subsequent production steps, for instance the removing of the absorption layer 2 and optionally cleaning of the substrate 1, can likewise be conducted analogously to the previous working example.

By means of the absorption layer 2, an automatic optical recognition which is favorable for mass production is simplified for the structuring of transparent substrates 1 as well. In addition, the reliability of the lithography method can be increased, for example on account of simplified focusability. For instance, especially in conjunction with the multistage structuring method described using at least two mask layers, it is possible to produce growth substrates with a structure width reliably and in a manner suitable for mass production with small structure sizes and/or center-to-center distances.

The invention is not limited by the description with reference to the working examples. Instead, the invention encompasses every new feature and every combination of features, which especially includes any combination of features in the claims, even if this feature or this combination itself is not specified explicitly in the claims or the working examples.

The invention claimed is:

1. A method for producing a substrate having a structured surface, the method comprising:
   providing the substrate having a substrate body and having a surface to be structured;
   forming an absorption layer, a first mask layer and a second mask layer on the surface to be structured;
   forming openings in the second mask layer in which the first mask layer is exposed, wherein forming the openings in the second mask layer is carried out after forming the absorption layer, the first mask layer and the second mask layer on the surface to be structured;
   exposing the surface to be structured in a region of the openings;
   forming depressions in the surface to be structured in the region of the openings to form the structured surface of the substrate; and
   removing the absorption layer from the substrate.

2. The method as claimed in claim 1, wherein the surface to be structured is a surface of the substrate body.

3. The method as claimed in claim 1, wherein the surface to be structured is a surface of a layer applied to the substrate body.

4. The method as claimed in claim 1, wherein the openings in the second mask layer are formed by a lithographic exposure method, and wherein the absorption layer is designed to be absorbent with respect to radiation used in the exposure method.

5. The method as claimed in claim 1, wherein the first mask layer and the absorption layer are removed by a dry-chemical etching method in the region of the openings.

6. The method as claimed in claim 1, wherein the depressions are formed by an etching method which is selective with respect to the first mask layer.

7. The method as claimed in claim 1, wherein the second mask layer is removed prior to removing the absorption layer.

8. The method as claimed in claim 1, wherein the first mask layer is removed together with the absorption layer.

9. The method as claimed in claim 1, wherein the absorption layer is removed by a wet-chemical method.

10. A substrate comprising:
    a structured surface,
    wherein the substrate is a growth substrate for epitaxial deposition,
    wherein the substrate comprises a substrate body transparent in a visible spectral region,
    wherein the structured surface has depressions, which, at least in one direction, have a structure width of not more than 200 nm and/or a center-to-center distance of not more than 800 nm,
    wherein the structured surface is a structured surface of a layer arranged on the substrate body, and
    wherein the depressions extend completely through the layer to the substrate body so that the substrate body is exposed in a region of the depressions.

11. The substrate as claimed in claim 10, wherein the layer is a dielectric layer which is transparent to radiation in the visible spectral region.

12. The substrate as claimed in claim 10, wherein the depressions are configured as trenches that run parallel to one another with the center-to-center distance, and wherein the trenches extend in a lateral direction across an entire extent of the substrate and have the structure width perpendicular thereto.

13. A method for producing a substrate having a structured surface, the method comprising:

providing the substrate having a substrate body and having a surface to be structured;

forming an absorption layer, a first mask layer and a second mask layer on the surface to be structured;

forming openings in the second mask layer in which the first mask layer is exposed, wherein the forming of the openings in the second mask layer is carried out after the forming of the absorption layer, the first mask layer and the second mask layer on the surface to be structured, and wherein the openings extend completely through the second mask layer;

exposing the surface to be structured in a region of the openings by carrying out a first dry-chemical etching method in which the first mask layer and the absorption layer are removed in the region of the openings;

forming depressions in the surface to be structured in the region of the openings to form the structured surface of the substrate by carrying out a second dry-chemical etching method subsequent to the first dry-chemical etching method; and removing the absorption layer from the substrate.

14. The method as claimed in claim 13, wherein the etching stops at the surface to be structured in the first dry-chemical etching method.

15. The method as claimed in claim 13, wherein the first dry-chemical etching method is an ICP-RIE (reactive ion etching with inductively coupled plasma) method based on fluorine chemistry, and wherein the second dry-chemical etching method is a dry-chemical etching method based on chlorine chemistry.

\* \* \* \* \*